(12) United States Patent
Hedrick et al.

(10) Patent No.: US 10,090,255 B2
(45) Date of Patent: Oct. 2, 2018

(54) DICING CHANNELS FOR GLASS INTERPOSERS

(71) Applicant: GLOBALFOUNDRIES INC., Grand Cayman (KY)

(72) Inventors: Brittany L. Hedrick, Poughquag, NY (US); Vijay Sukumaran, San Jose, CA (US); Christopher L. Tessler, Poughquag, NY (US); Richard F. Indyk, Wappingers Falls, NY (US); Sarah H. Knickerbocker, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 98 days.

(21) Appl. No.: 15/010,868

(22) Filed: Jan. 29, 2016

(65) Prior Publication Data

US 2017/0221837 A1 Aug. 3, 2017

(51) Int. Cl.
| | |
|---|---|
| H05K 1/11 | (2006.01) |
| H05K 1/18 | (2006.01) |
| H05K 3/00 | (2006.01) |
| H01L 23/00 | (2006.01) |
| H01L 21/78 | (2006.01) |
| H01L 23/498 | (2006.01) |
| H01L 21/48 | (2006.01) |
| H05K 1/03 | (2006.01) |
| H01L 23/15 | (2006.01) |

(52) U.S. Cl.
CPC .......... *H01L 23/562* (2013.01); *H01L 21/486* (2013.01); *H01L 21/78* (2013.01); *H01L 23/15* (2013.01); *H01L 23/49811* (2013.01); *H01L 23/49827* (2013.01); *H05K 1/0306* (2013.01); *H05K 3/0052* (2013.01); *H01L 2224/11* (2013.01); *H01L 2224/73204* (2013.01); *H05K 3/0026* (2013.01); *H05K 3/0094* (2013.01); *H05K 2201/0959* (2013.01); *H05K 2201/10378* (2013.01)

(58) Field of Classification Search
CPC ......... H05K 3/0052; H05K 1/11; H05K 1/181
See application file for complete search history.

(56) References Cited

U.S. PATENT DOCUMENTS

| | | | |
|---|---|---|---|
| 7,767,496 B2 | 8/2010 | Shim et al. | |
| 8,110,914 B2 | 2/2012 | Kang et al. | |
| 2013/0294034 A1* | 11/2013 | Kanryo | ................. H01L 21/561 361/728 |
| 2015/0373842 A1* | 12/2015 | Min | ........................ H05K 1/02 428/47 |

FOREIGN PATENT DOCUMENTS

EP          2325878          5/2011

* cited by examiner

*Primary Examiner* — Jeremy C Norris
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to dicing channels used in the singulatation process of interposers and methods of manufacture. The structure includes: one or more redistribution layers; a glass interposer connected to the one or more redistribution layers; a channel formed through the one or more redistribution layers and the glass interposer core, forming a dicing channel; and polymer material conformally filling the channel.

20 Claims, 8 Drawing Sheets

DICING CHANNELS FOR GLASS INTERPOSERS

FIELD OF THE INVENTION

The present disclosure relates to semiconductor structures and more particularly, to the fabrication of dicing channels to be implemented towards a singulation method for glass die/interposers.

BACKGROUND

Semiconductor integrated circuit chips and interposers fabricated on both silicon and glass are susceptible to cracking due to defects incurred during dicing operations, at the edge of the singulated chip. These defects act as crack initiation points as the interposer or chip experiences stresses during cycling induced by front and backside layers as well as Cu filled vias and coefficients of thermal expansion (CTE) mismatches. In glass interposers these stresses can be particularly detrimental.

To prevent crack propagation within delicate dielectric levels, laser ablation is commonly performed to remove continuous dielectric levels of the multiple redistribution layers (RDL) in the kerf prior to mechanical dicing operations. Although ablating the dielectric layers prevents them from incurring damage while dicing occurs, it does not address the damage induced to the substrate.

SUMMARY

In an aspect of the disclosure, a structure includes: one or more redistribution layers; a glass interposer connected to the one or more redistribution layers; a channel formed through the one or more redistribution layers and the glass interposer core, forming a dicing channel; and polymer material conformally filling the channel In an aspect of the disclosure, a structure includes: a glass interposer core; one or more wiring layers on a first side of the glass interposer core; a pad structure on a second side of the glass interposer core, connected to the one or more wiring layers by a via interconnect structure extending through the glass interposer; a channel formed through the one or more wiring layers and the glass interposer core; and polymer material conformally filling the channel and encapsulating the glass interposer core.

In an aspect of the disclosure, a method includes: forming one or more channels through a glass interposer and one or more wiring layers comprised of dielectric material; filling the one or more channels with polymer material; and dicing the glass interposer and one or more wiring layers using the one or more channels filled with polymer material to protect an edge of a chip from damage and crack propagation from a dicing blade.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to dicing channels used in the singulatation process of glass die or interposers and methods of manufacture. More specifically, the present disclosure provides methods of implementing a dicing channel for glass interposers mid-process and related structures which include, for example, full encapsulation of the glass interposer by a polymer material. Advantageously, the methods and structures described herein prevent defect mitigation during the dicing operations. This is accomplished by preventing damage at the edge of the chip by, e.g., (i) eliminating blade or saw dicing of the glass interposer, (ii) protecting the glass interposer from environmental conditions, and (iii) encapsulating the glass interposer within a protective polymer to enhance the robustness of the glass interposer and minimize sources of crack initiation.

In embodiments, the processes and structures described herein allow for edge defects to be avoided all together by pre-singulating the glass interposer, and eliminating any contact between a dicing blade and the glass interposer. By avoiding contact between the edge of the die and the dicing blade, defects or flaws for crack propagation are avoided. Also, by implementing the methods and structures herein, the encapsulation of the glass interposer with polymer material can be performed during in-line processing, with no need for post singulation treatment processes.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses four basic building blocks: (i) deposition of thin films of material on a substrate, (ii) applying a patterned mask on top of the films by photolithographic imaging, (iii) electroplating metal selectively within defined resist features, and (iv) etching blanket seed metal or films selectively based on the mask pattern.

Figure 1A:
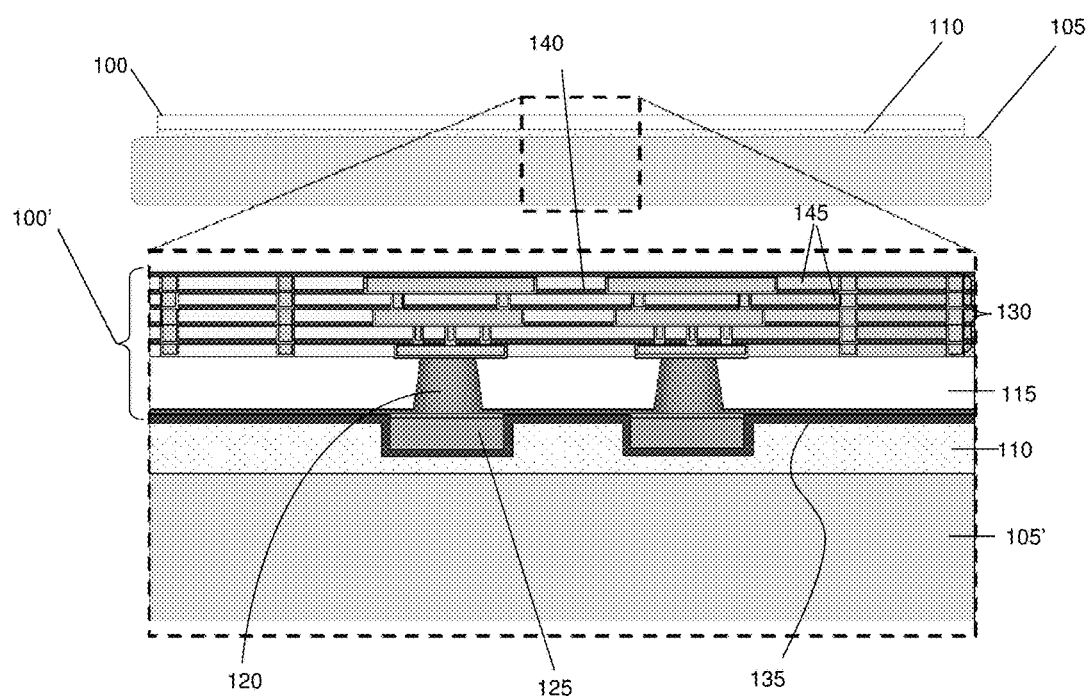
FIGS. 1A-1J show structures and respective fabrication processes in accordance with aspects of the present disclosure.

FIGS. 1A-1J show structures and respective fabrication processes in accordance with aspects of the present disclosure. More specifically FIG. 1A shows a carrier 105 supporting a thinned interposer, in embodiments, fabricated from either a wafer or panel, 100, bonded together using, for example, an adhesive 110. In embodiments, the wafer or panel 100 can be bonded to the carrier 105 using other known methods such as, for example, oxide-to-oxide bonding as represented by reference numeral 110. FIG. 1A also shows a representative cross-section of a single interposer die 100' on carrier segment 105', as part of the entire wafer or panel 100, in the middle of the fabrication process, before bumping and to dicing operations. In embodiments, the chip carrier 105' and by extension the wafer/panel carrier 105 can be glass, for example, although other substrates are also contemplated by the present disclosure.

In embodiments, the glass interposer chip 100' includes a portion of the glass wafer or panel 115, also referred herein as the interposer core, with multiple wiring levels 130 on one surface, and under bump (UBM) structures 125 on the opposing surface. The glass wafer or panel 115 includes a through glass via 120 connecting electrically to the pad structure 125, e.g., under ball metallurgy (UBM) structure, and wiring layers 130 on opposing sides thereof. In embodiments, the through glass via 120, UBM structure 125 and wiring layers 130 can be manufactured using conventional processes as should be known to those of ordinary skill in the art.

By way of example, the through glass via 120 begins with a blind via within the glass wafer or panel 115, hereafter referred to as a wafer. A dielectric liner (e.g., oxide or nitride material) is formed in the blind via using conventional deposition methods such as chemical vapor deposition (CVD) processes. A seed layer is formed over the dielectric liner, followed by a copper electroplating process to form the conductive through glass via 120. Any excess copper formed on the surface of the glass wafer 115 can be removed by chemical mechanical polishing (CMP) processes.

The UBM structure 125 is formed in contact with the through glass via 120 by deposition of a metal material (or multiple metal materials) used in UBM structures. For example, a TiW/Cu, titanium/Cu or other seed layer material or stack can be formed on the surface of the glass wafer 115 and on top of the through glass via 120, using the conventional process of physical vapor deposition (CVD) or sputtering. Following the deposition of a conductive seed material (e.g., Ti/copper). A spin on resist or other photosensitive film can be patterned selectively using photolithography to define openings in the resist in which conductive material (i.e., copper and/or solder) will be electroplated. After plating, the photoresist is removed and the conductive seed metal in the field is removed through a wet or dry etching processes to form the defined and electrically isolated UBM structures 125.

An insulating capping layer 135 is formed over the UBM structure 125 and in the field of 115. The capping layer (e.g., film) 135 can be deposited using conventional CVD processes. In embodiments, the capping layer 135 can be a dielectric material which encapsulates the UBM structure 125. For example, the capping layer 135 can be SiN material. Over the top of the capping layer 135 is joined the temporary wafer carrier 105, bonded by an adhesive 110 or other bonding techniques known to those of ordinary skill in the art.

Still referring to FIG. 1A, the glass wafer 115 is ground down to expose the through glass via 120, on an opposing side from the UBM structure 125. A plurality of wiring layers and via interconnects, referred to throughout as redistribution levels (RDL), designated at reference numeral 130, are formed on the ground surface or grindside of the glass wafer 115. Although five (5) wiring layers are shown, it should be understood that any number of wiring layers are contemplated herein.

In embodiments, the wiring layers and via interconnects can be formed by conventional damascene processes within dielectric layers (e.g., oxide) 140. The conventional damascene process is well understood by those of ordinary skill in the art such that no further explanation is required for an understanding of the present disclosure. In embodiments, the wiring layers and dielectric layer material are "redistribution layers" (RDL). The dielectric layers 140 can be separated by a capping material 145. In embodiments, the capping material 145 can be a SiN material, as an example, formed using conventional CVD processes. The SiN is impervious to DHF processes.

Figure 1B:
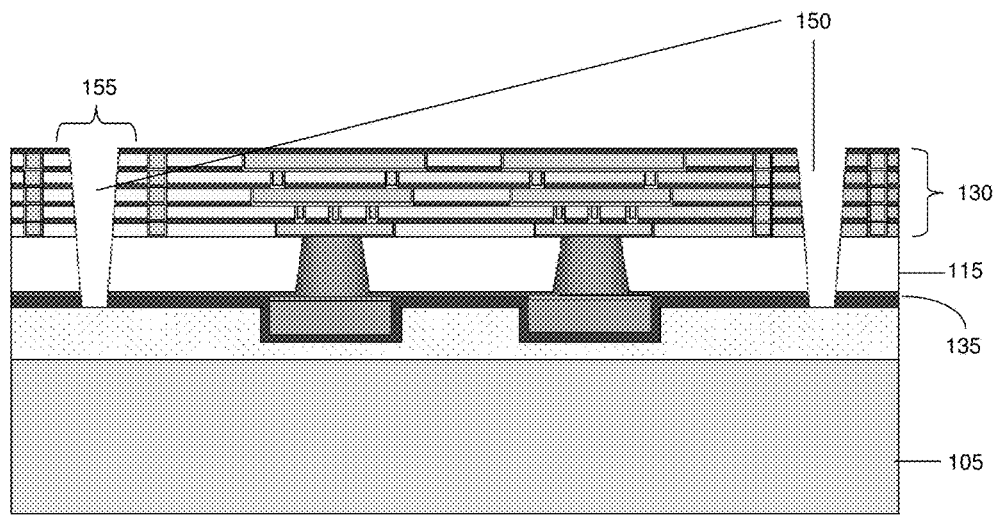

In FIG. 1B, a channel or trench 150 (hereinafter referred to as a "channel") is formed through the wiring layers 130, the glass interposer 115 and the capping layer 135. In embodiments, the channel 150 can be formed on each side of each of the chip, e.g., within a dicing street, as designated by reference numeral 155. In embodiments, the dicing street can be the kerf area separating the plurality of chips. The channel 150 will allow for singulation of the chips 100', as well as protection of the RDL 130 and glass core 115 from dicing processes, e.g., crack propagation.

In embodiments, the channel 150 can be formed by laser scribing processes through the glass core 115, the capping layer 135 and the RDL wiring layers 130. The aspect ratio of the channel 150 can be approximately 2:1, 3:1 or other aspect ratios depending on the cumulative thickness of the RDL 130, glass core 115, and capping layer 135 versus the kerf width 155, and the dicing blade dimensions to be accommodated. By way of illustrative, non-limiting example, the width of the channel can be about 38 μm and the depth can range from about 76 μm to about 114 μm; although other dimensions are also contemplated by the present disclosure. Also, through tailoring of the laser process and parameters (e.g., multiple steps with various wavelengths) it is possible to have the laser drill to a desired depth without drilling too far into the layer 110. A DHF etch can be used to clean up the sidewalls of the channel 150, which is useful for healing any damage to the glass interposer core material 115 itself.

Figure 1C:
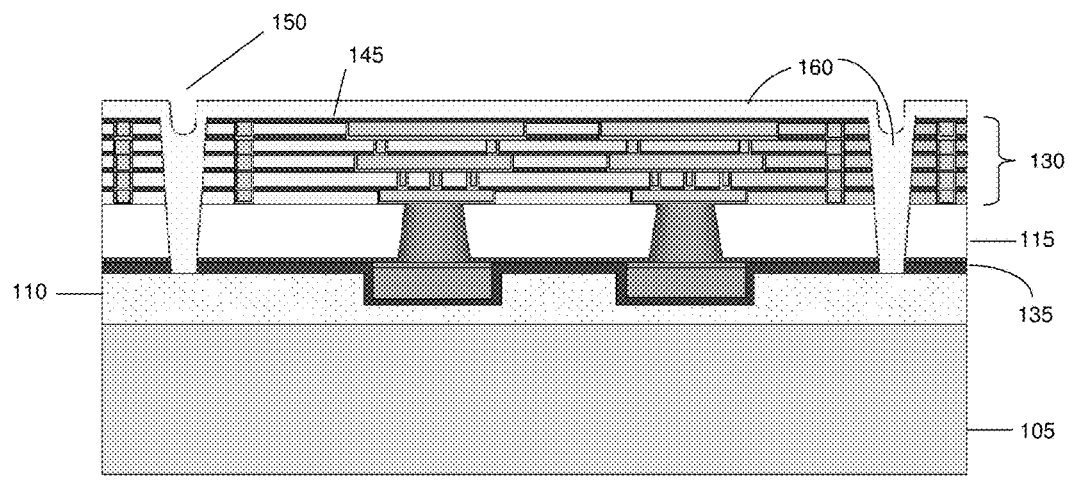

As shown in FIG. 1C, a polymer material 160 is applied within the channel 150 and over the uppermost capping layer 145. The polymer material 160 can be conformally deposited to fill the channel 150. In embodiments, the polymer material 160 can be, e.g., a photosensitive material. For example, the polymer material 160 can be PSPI (Photosensitive Polyimide) or poly(benzoxazole) PBO applied using a spin-on process. The polymer material 160 can then undergo exposure and developing processes as should be understood by those of ordinary skill in the art. Shrinkage of the polymer is possible during subsequent cure processes and sufficient material should be deposit to ensure continuous coverage of the glass interposer sidewalls and RDL.

Figure 1D:
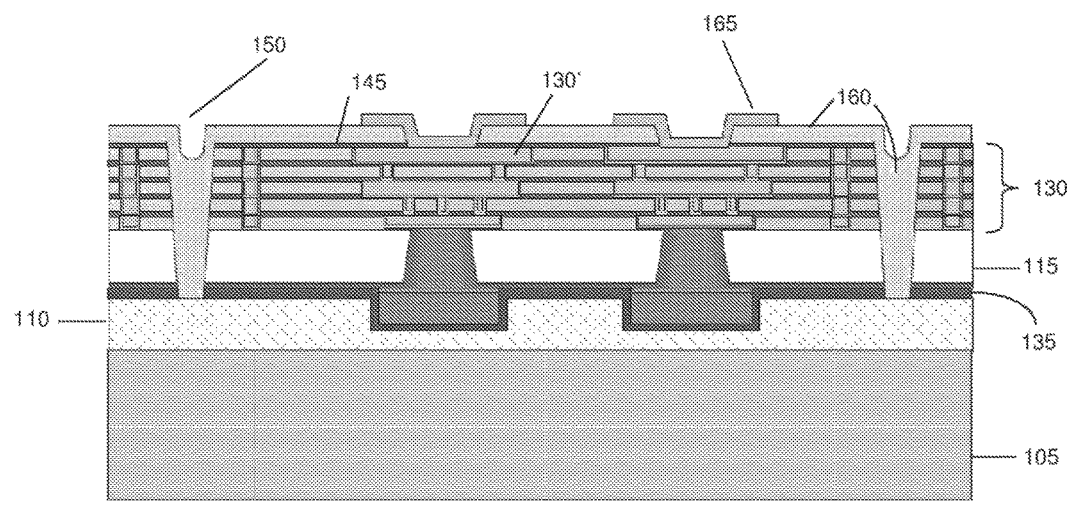

FIG. 1D shows additional fabrication processing steps and respective structure in accordance with aspects of the disclosure. More specifically, in FIG. 1D, a portion of the polyimide material 160 and uppermost capping layer 145 is removed to form an opening, exposing the upper wiring layer 130'. To form the opening in the polyimide material 160 and expose the underlying capping layer 145, the polyimide material 160 can be exposed to energy (e.g., light) using conventional lithography processes, and developed to open the selectively exposed region. The polyimide material 160 can be cured (e.g., hardened), such that it will remain in place and also act as a masking layer for etching processes to remove a portion of the uppermost capping layer 145 (e.g., SiN), exposing the upper wiring layer 130'. In embodiments, the etching process is a reactive ion etch (RIE) using chemistries that will etch the material of the capping layer 145. A non-photosensitive material can be utilized in place of PBO or PSPI and can be patterned by selective removal by laser ablation.

Still referring to FIG. 1D, a terminal layer 165 is formed in the opening and in direct contact with the upper wiring layer 130'. In embodiments, the terminal layer 165 can be, e.g., a capture pad to receive die to join on top of the interposer chip later during package assembly. The terminal layer 165 can be a copper/nickel/gold material; although, other conductive materials are also contemplated by the present disclosure. In embodiments, the terminal layer 165 is formed by first applying a seed layer and then defined in resist through standard lithography processes, and plated in the selectively opened regions of the resist by a plating process, e.g., electroplating. The terminal layer 165 can be patterned using conventional lithography and plating, afterwards resist strip and etching (e.g., WETS, or RIE) to electrically isolate each pad, as should be known to those of ordinary skill in the art such that further explanation is not needed to understand the present disclosure.

Figure 1E:
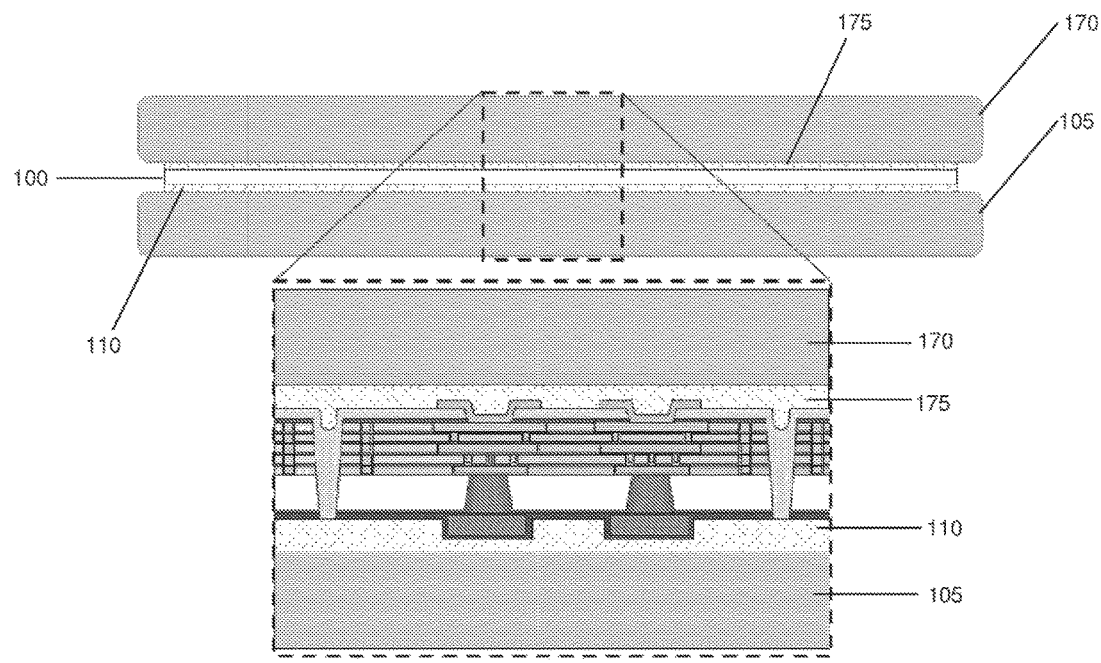

As shown in FIG. 1E, a second carrier 170 is bonded to the wafer 100 in a similar manner as already described herein. For example, the wafer carrier 170 can be bonded to the wafer 100 by an adhesive or an oxide-to-oxide bond any of which are represented by reference numeral 175. As shown in FIG. 1E, the wafer carrier 170 is bonded to the wafer 100 on an opposing side from the wafer carrier 105.

Figure 1F:
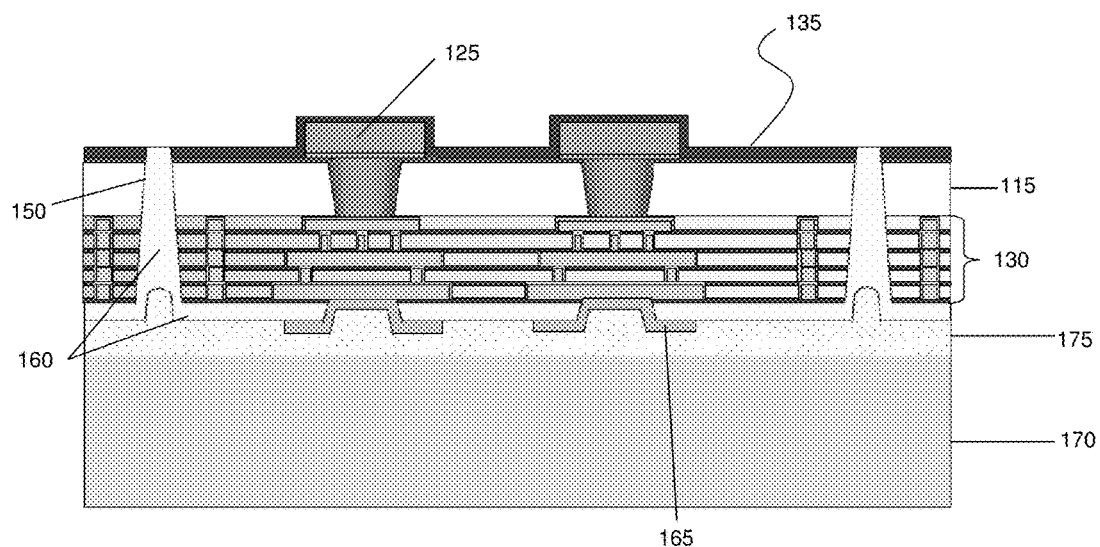

In FIG. 1F, the bonded wafer is flipped over and the wafer carrier 105 is released using conventional processes. The release of the wafer carrier (and removing of the bonding material) exposes the (UBM) structure 125 and, more specifically, the capping layer 135 formed over the UBM structure 125.

Figure 1G:
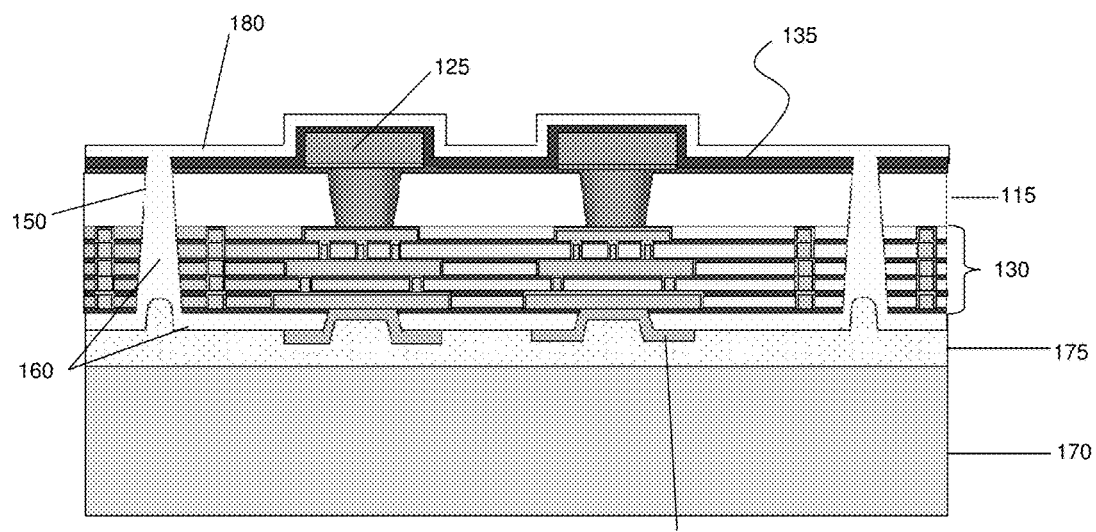

In FIG. 1G, a polymer material 180, e.g., polyimide photosensitive material or PBO, is deposited over the capping layer 135 and in contact with the polymer material 160 formed within the channel 150. The polymer material 180 and the polymer material 160 will coalesce and completely encapsulate the glass interposer both the core 115 and RDL 130.

In embodiments, the polyimide material 180 can be exposed to energy using conventional lithography processes (e.g., exposure to light) to form an opening. Additionally non-photosensitive materials can be opened using selective patterning by laser ablation. The polymer material 180 can be cured (e.g., hardened) such that it will act as a masking layer for etching processes to remove a portion of the capping layer 135 (e.g., SiN), exposing the UBM structure 125. In embodiments, the etching process of the capping layer 135 is a RIE using chemistries that will etch the material of the capping layer 135.

Figure 1H:
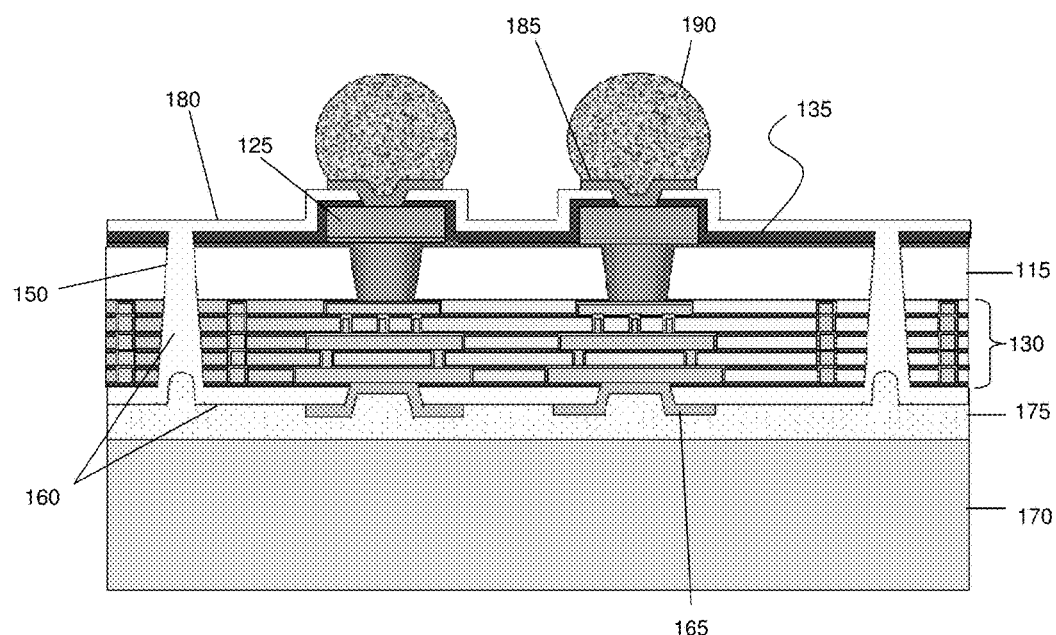

Referring to FIG. 1H, a ball limiting metallurgy (BLM) 185 is formed through the opening and in direct contact with the UBM structure 125. In embodiments, the BLM 185 can be a TiW/Cu or Titanium/Copper material stack; although, other conductive materials are also contemplated by the present disclosure. The BLM 185 and plated solder can be formed by first applying a seed layer followed by a photolithographic process to pattern resist and define openings for features to be plated, through electroplating process followed by resist strip and etching (e.g., WET or RIE) processes of the seed metal in the field. After seed metal etch the wafer undergoes reflow to define the spherical bump 190. In embodiments, the solder bump 190 can be a C4 solder ball or micro solder bump, Cu pillar, etc.

Figure 1I:
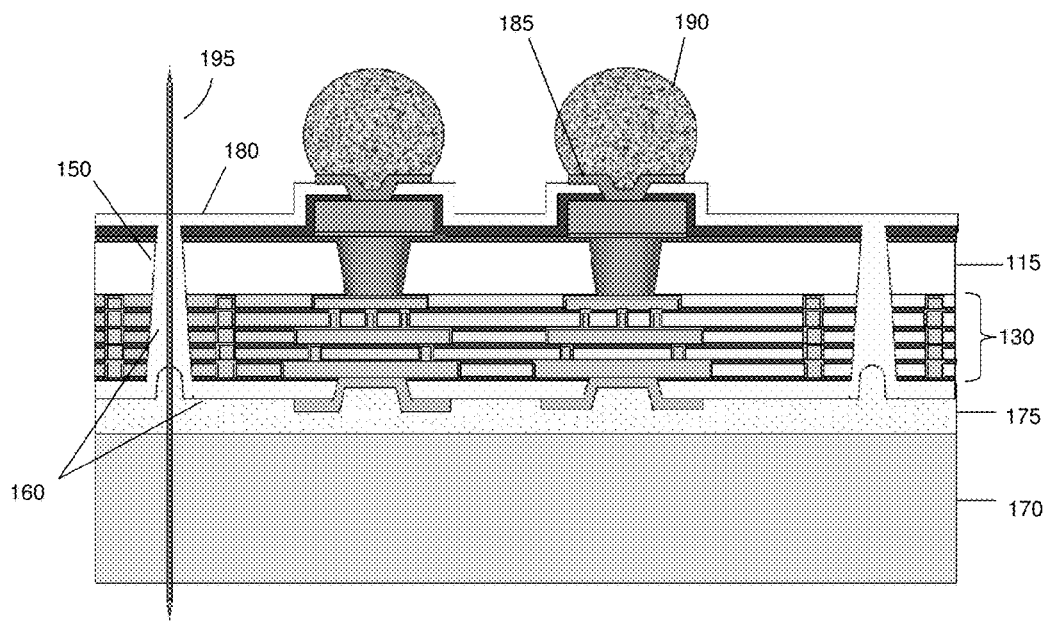

As shown in FIG. 1I, a dicing operation is performed through the polymer materials 180 and 160 formed within the channel 150. In embodiments, the dicing operation can be performed by a dicing blade as represented by reference numeral 195. The composition and the construction of the dicing blade as well as the dicing process parameters of RPM's and infeed rates are tailored specifically to the co-dicing of polymeric materials 180 and 160, adhesive 175 and the carrier wafer 170 material. In embodiments, the channel 150 is of sufficient width to accommodate the dicing blade 195. FIG. 1I is not to scale, e.g., the channel could be many times wider than the actual blade width dimension. The channel should fit within the kerf width and therefore could be several 100 microns wide given the design. More particularly, the dimensions of the channel 150 will be sufficient to ensure that the polymer material 160 remains intact and that there is no contact between the dicing blade 195 and the glass interposer core 115 (or other portions of the chip including the RDL 130). In this way, by avoiding contact with the edge of entire the interposer chip 100' and the dicing blade 195, no defects or flaws are created and crack propagation will be avoided.

Figure 1J:
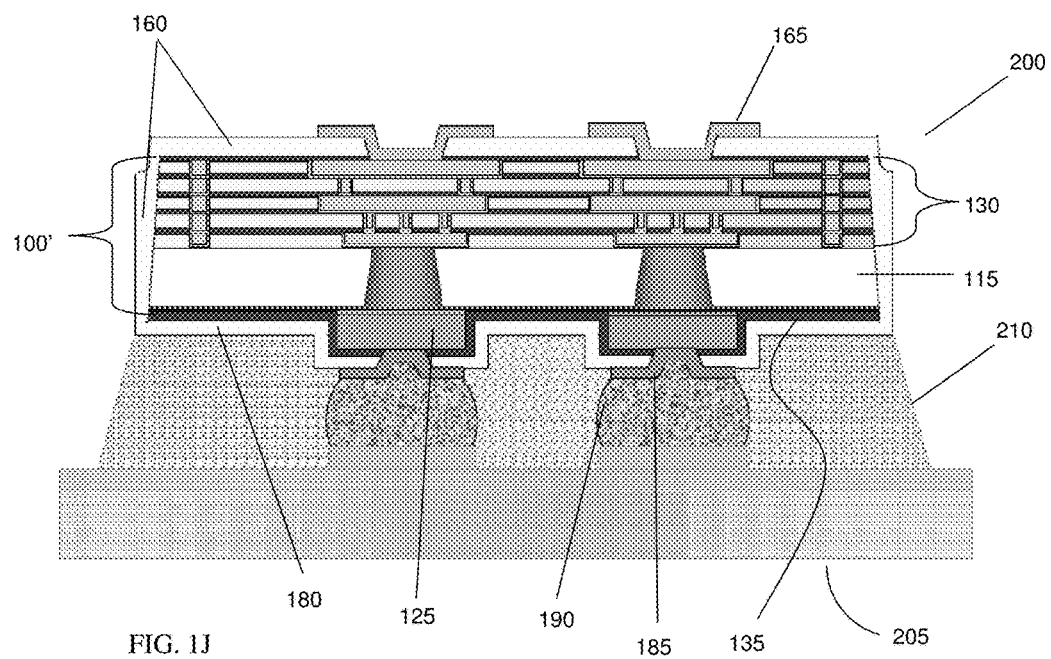

FIG. 1J shows the partially assembled package of a singulated glass interposer 200 joined to a laminate or ceramic structure 205. In embodiments, the interposer to ceramic or laminate structure joint is provided through conventional solder ball connections. The solder connections and, more specifically, the space between the singulated glass die 200 and the laminate or ceramic structure 205 can be fully encapsulated with underfill material 210. The wafer carrier 170 can also be released in subsequent processes. Once the surface of the singulated die 200 cleaned, the capture pads 165 are exposed and available to receive top die for completion of package assembly. The interposer chip 100' will remain fully encapsulated by polymer. Thus, the structure will be comprised of a glass interposer core 115, with multi-level RDL 130 terminated in capture pads 165, and on the opposite side UBM pads 125, terminated with solder balls 190, the RDL 130, glass core 115 and UMB 125 all encapsulated by the polymer material.

Figure 2A:
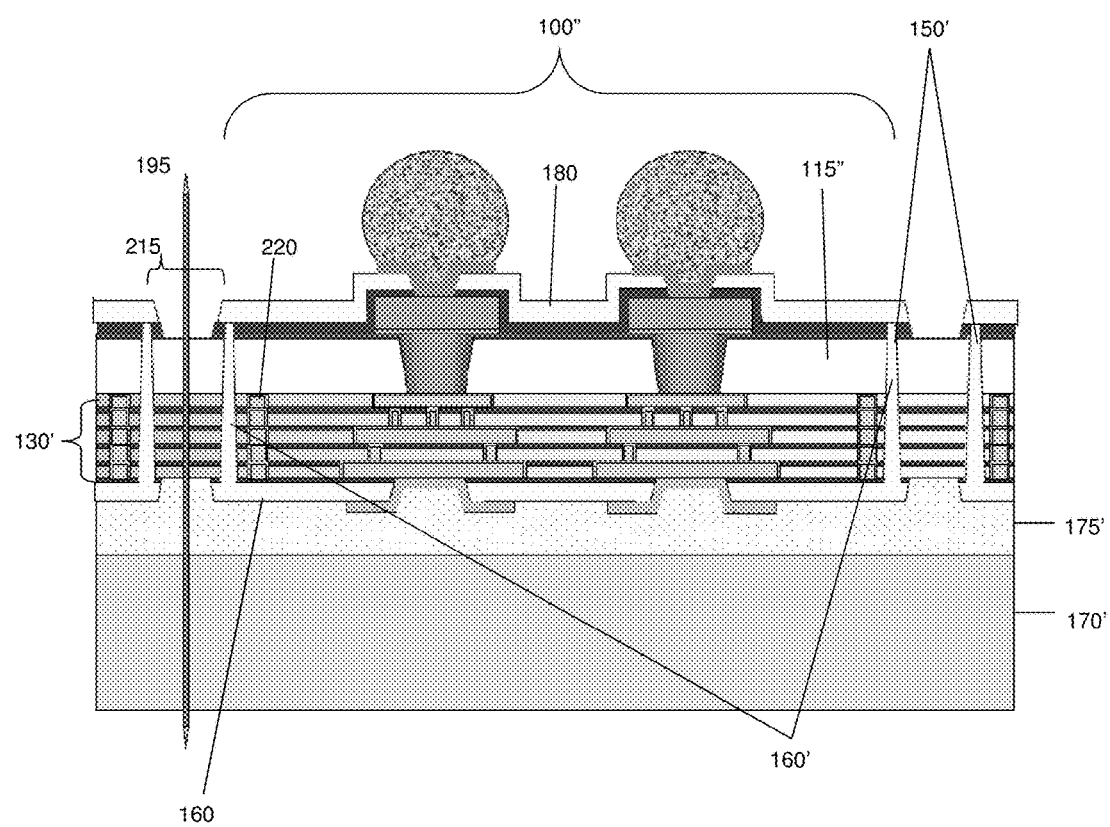
FIG. 2A shows a structure and respective fabrication processes in accordance with additional aspects of the present disclosure.

FIG. 2A shows a structure and respective fabrication processes in accordance with additional aspects of the present disclosure. In particular, FIG. 2A shows a structure 100" undergoing a dicing process. The composition and the construction of the dicing blade as well as the dicing process parameters of RPM's and infeed rates are tailored specifically to the co-dicing of polymeric materials 180, glass interposer 115, RDL dielectric layers 130, adhesive material 175 and the carrier wafer 170 material. In embodiments, the structure 100" includes two channels 150' formed on opposing sides of the kerf 215, bordering a dicing street. The channels 150' can be formed in the manner as described with respect to FIGS. 1B-1D, e.g., laser scribing processes. In embodiments, the channels 150' are filled polymer material 160, e.g., photosensitive polyimide material or PBO, patterned to be excluded in the kerf, which is defined by region 215. Subsequently polymer 180 is patterned, on the opposite surface, in such a way that it overlaps with the polymer 160 within the groove 150', but is also excluded from the kerf. This kerf region between the two channels 150' would be of typical design and dimension to accommodate the dicing blade 195. In embodiments, the polymers 160 and 180 are patterned to ensure removal from the kerf streets, but encompassing of groves 150' in the active region. Patterning the polymer in this manner, clears the path for dicing blade singulation, and also removes the material from the streets to truncate the polymer within the active die region only; the polymer is not continuous across the wafers surface thus minimizing the impact of the material to stress and warp the wafer.

In embodiments, the dicing process is performed by the dicing blade 195, within the space 215. In embodiments, the dimension of the space 215 in combination with the location of channels 150' within the dimensions of the finished chip edge, will ensure that the polymer material 160 remains intact on the chip 100' and that there is no contact between the dicing blade 195 and the glass interposer core 115' in the active region, and RLD 130' which is forming the chip 100". In this way, by avoiding contact with the edge of the chip 100' and the dicing blade 195, no defects or flaws are created and crack propagation will be avoided. Additionally the presence of groove 150', and polymer 160 within, between the diced edge of the interposer 100" and the interposer core 115' and RDL levels 130', forms a barrier to protect both the chip and RDL, beyond what the crackstop structures 220 would achieve.

In embodiments, the polymers 160 and 180 can be patterned to ensure removal from the kerf streets. In this way, the dicing blade is not subject to exposure to the polymer and can be done in a conventional method. This patterning can be accomplished by conventional photolithography or laser ablation techniques. The effect of any potential damage to the substrate material induced by the laser ablation process is mitigated by the fact that the polymer filled channels 150' will act as crack arrestors so the damage will not propagate into the electrically active area of the interposer during use. Additionally, removing the material from the streets ensures the polymer is not continuous across the wafers surface and only in place in the active die sites. This minimizes the impact of the film to stress and warp the wafer.

Figure 2B:
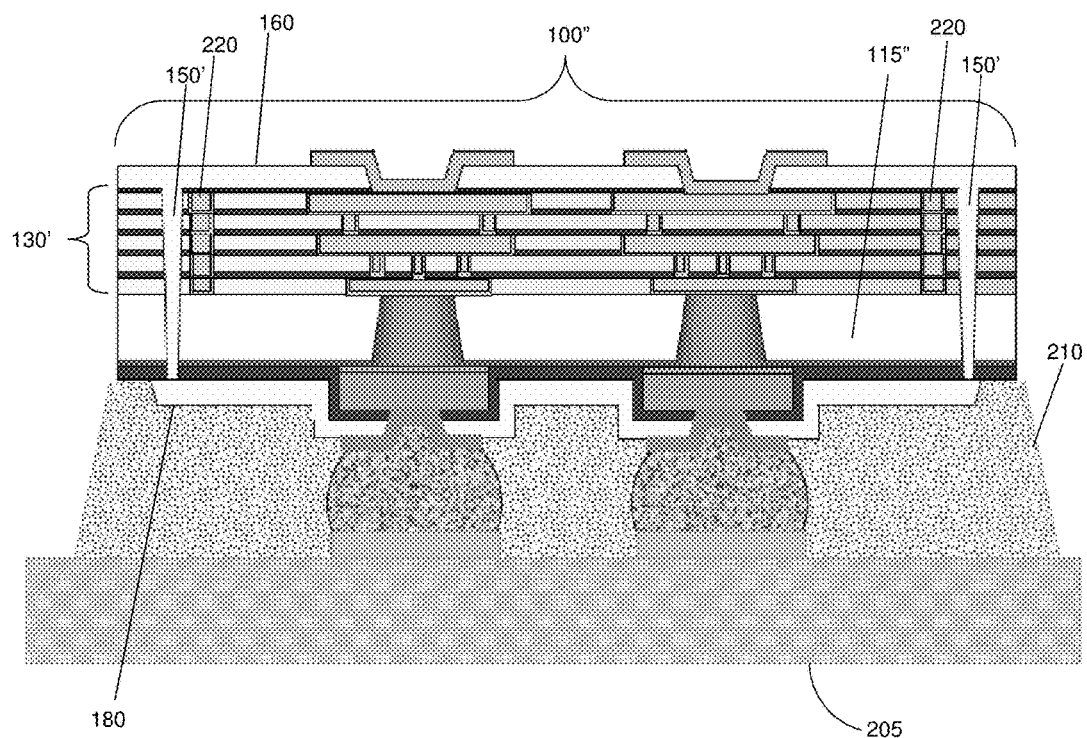
FIG. 2B shows a singulated interposer die in accordance with additional aspects of the present disclosure.

FIG. 2B shows the singulated interposer die 100" after the final carrier 170' has been removed and assembled onto a laminate or ceramic package 205, and underfilled, with an underfill material 210.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from gaming systems, cell phones, and other low-end applications to advanced computer products including personal computers, servers and other devices utilizing a central processor, memory, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   one or more redistribution layers;
   under ball metallurgy (UBM) structures electrically connected to the redistribution layers;
   a glass interposer connected to the one or more redistribution layers;
   a capping layer on the glass interposer and over the UBM structures;
   a channel formed through the one or more redistribution layers and the glass interposer core, forming a dicing channel; and
   polymer material conformally filling the channel, and over the one or more redistribution layers, the capping layer and the UBM structures to provide an encapsulation of the glass interposer and continuous coverage of the one or more redistribution layers.

2. The structure of claim 1, wherein the polymer material is Photosensitive Polyimide (PSPI) or PBO patterned through one of standard photolithography methods and a non-photosensitive polymer material patterned through laser ablation.

3. The structure of claim 1, wherein the polymer material encapsulates the glass interposer and core.

4. The structure of claim 1, wherein the polymer material conformally fills the channel and is further provided on an upper surface of the one or more redistribution layers.

5. The structure of claim 4, wherein the polymer material is provided on a second side of the glass interposer, fully encapsulating the glass interposer.

6. The structure of claim 1, wherein the channel is a single channel within a kerf space.

7. The structure of claim 1, further comprising a second channel formed through the one or more redistribution layers and the glass interposer, wherein the first channel and the second channel border a dicing street.

8. The structure of claim 7, wherein the first channel and the second channel are formed on sides of adjacent chips to be singulated.

9. The structure of claim 1, wherein the channel extends completely through the glass interposer and the capping layer material on the glass interposer which protects the UBM structures.

10. The structure of claim 1, wherein the channel is larger than a thickness of a dicing blade.

11. The structure of claim 1, wherein the polymer material within the channel protects an edge of a chip including the one or more redistribution layers from a dicing blade during dicing processes.

12. A structure, comprising:
    a glass interposer core;
    one or more wiring layers on a first side of the glass interposer core;
    a pad structure on a second side of the glass interposer core, connected to the one or more wiring layers by a via interconnect structure extending through the glass interposer;
    a channel formed through the one or more wiring layers and the glass interposer core;
    a polymer material conformally filling the channel and encapsulating the glass interposer core; and
    a polymer layer on the pad structure and in contact with the polymer material, the polymer layer coalescing into the polymer material and encapsulating the glass interposer core and the one or more wiring layers.

13. The structure of claim 12, wherein the polymer material is Photosensitive Polyimide (PSPI) or PBO.

14. The structure of claim 12, wherein the polymer material is provided on an upper surface of the one or more wiring layers.

15. The structure of claim 12, wherein the channel is a single channel within a kerf.

16. The structure of claim 12, further comprising a second channel formed through the one or more wiring layers and the glass interposer core, wherein the first channel and the second channel border a dicing street.

17. The structure of claim 16, wherein the channel and the second channel are filled with the polymer material and are positioned on sides of adjacent chips to be singulated, the channel and the second channel are formed within the one or more wiring layers and the glass interposer core, and the channel and the second channel are wide enough to ensure that the polymer material remains intact and that there is no contact between a dicing blade and the glass interposer core during dicing processes.

18. A method, comprising:
    forming one or more channels through a glass interposer and one or more wiring layers comprised of dielectric material;
    depositing a capping layer on the glass interposer and over under ball metallurgy (UBM) structures, the UBM structures being encapsulated by the capping layer and electrically connected to the one or more wiring layers;
    filling the one or more channels and covering the one or more wiring layers, the capping layer and the UBM structures with a polymer material to encapsulate the glass interposer and the one or more wiring layers and provide continuous coverage of the one or more wiring layers; and
    dicing the glass interposer and one or more wiring layers using the one or more channels filled with polymer material to protect an edge of a chip from damage and crack propagation from a dicing blade.

19. The method of claim 18, wherein the dicing occurs within the channels filled with polymer material.

20. The method of claim 18, wherein the dicing occurs between the channels filled with polymer material.

\* \* \* \* \*